(12) United States Patent
Yune

(10) Patent No.: US 7,803,709 B2
(45) Date of Patent: Sep. 28, 2010

(54) METHOD OF FABRICATING PATTERN IN SEMICONDUCTOR DEVICE USING SPACER

(75) Inventor: Hyoung Soon Yune, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 533 days.

(21) Appl. No.: 11/949,962

(22) Filed: Dec. 4, 2007

(65) Prior Publication Data

US 2009/0004867 A1 Jan. 1, 2009

(30) Foreign Application Priority Data

Jun. 29, 2007 (KR) ................ 2007-65854

(51) Int. Cl.
*H01L 21/302* (2006.01)
*H01L 21/461* (2006.01)
(52) U.S. Cl. .................. 438/689; 438/696; 438/703; 438/706; 438/717
(58) Field of Classification Search ............ None
See application file for complete search history.

(56) References Cited

U.S. PATENT DOCUMENTS

| | | | |
|---|---|---|---|
| 4,838,991 A | * | 6/1989 | Cote et al. ............ 216/46 |
| 5,795,830 A | * | 8/1998 | Cronin et al. ......... 438/696 |
| 6,063,688 A | * | 5/2000 | Doyle et al. .......... 438/424 |
| 6,664,173 B2 | | 12/2003 | Doyle et al. |
| 7,115,525 B2 | | 10/2006 | Abatchev et al. |
| 2004/0010769 A1 | | 1/2004 | Chang et al. .......... 716/21 |
| 2006/0211260 A1 | | 9/2006 | Tran et al. ............. 438/763 |

FOREIGN PATENT DOCUMENTS

| | | |
|---|---|---|
| JP | 06-045590 A | 2/1994 |
| JP | 2000-173979 A | 6/2000 |
| JP | 2007-150166 A | 6/2007 |
| KR | 10-2001-0017089 | 3/2001 |

* cited by examiner

*Primary Examiner*—Duy-Vu N Deo
(74) *Attorney, Agent, or Firm*—Marshall, Gerstein & Borun LLP

(57) ABSTRACT

A method of fabricating patterns of a semiconductor device includes the steps of forming first sacrificial layer patterns over a pattern target layer; forming first spacers on sidewalls of the first sacrificial layer patterns; forming a second sacrificial layer pattern over the first sacrificial layer patterns and the first spacers such that at least one of the first spacers is exposed by the second sacrificial layer pattern; forming a dual spacer by forming a second spacer on the exposed first spacer; removing the second sacrificial layer pattern and the first sacrificial layer patterns; and forming a first pattern having a first pitch defined by the first spacers and a second pattern having a second pitch defined by the dual spacer by etching an exposed portion of the pattern target layer using the first spacers and the dual spacer as etching masks.

6 Claims, 5 Drawing Sheets

METHOD OF FABRICATING PATTERN IN SEMICONDUCTOR DEVICE USING SPACER

CROSS-REFERENCE TO RELATED APPLICATION

Priority to Korean application number 10-2007-0065854, filed on Jun. 29, 2007, which is incorporated by reference in its entirety, is claimed.

BACKGROUND OF THE INVENTION

The invention relates to a method of fabricating a semiconductor device and, more particularly, to a method of fabricating patterns in a semiconductor device using a spacer.

In general, a plurality of devices constituting a semiconductor device, for example, an active device such as a transistor or a passive device such as a register, have been embodied in the form of patterns. For example, the transistor has a structure including a gate insulating layer and a gate electrode layer that are disposed on a semiconductor substrate. In particular, the gate insulating layer and the gate electrode layer have a predetermined pattern structure, such as a stripe.

A photolithography process is generally used to form the patterns. That is, a photoresist layer pattern is formed on a target layer to be patterned, and an exposed portion of the target layer is removed through an etching process using the photoresist layer pattern as an etching mask, thereby obtaining a required pattern. However, with increasing levels of integration, the above method becomes more limited. Specifically, although the pitch of the patterns decreases as the semiconductor device becomes more highly integrated, the photolithography process technology does not keep pace with the decrease of the pattern pitch due to its basic limitation.

Accordingly, a method for fabricating the patterns using spacers has been suggested to form patterns having micro pitches. According to this method, a sacrificial layer pattern is formed on a target layer to be formed with the patterns, and the spacers are formed on sidewalls of the sacrificial layer pattern. Then, the sacrificial layer pattern is removed and an exposed portion of the target layer is removed through an etching process using the spacers as an etching mask. In general, the spacers can be formed with a sufficient thickness and the thickness of the spacers can be easily controlled. Thus, the patterns having micro pitches can be formed by using the spacers. However, because the spacers are formed at the same time, the spacers have the same thickness throughout the entire region. Accordingly, the patterns have the same pitch. However, it is often desirable to form patterns having different pitches using a single patterning process. In such a case, an additional mask process must be performed to form the variable-pitch patterns.

SUMMARY OF THE INVENTION

Embodiments of the invention are directed to providing a method of fabricating patterns having different pitches in a semiconductor device using a spacer.

In one embodiment, a method of fabricating patterns of a semiconductor device includes forming first sacrificial layer patterns having sidewalls over a pattern target layer; forming first spacers on the sidewalls of the first sacrificial layer patterns; forming a second sacrificial layer pattern over the first sacrificial layer patterns and the first spacers, wherein at least one of the first spacers is exposed by the second sacrificial layer pattern; forming a dual spacer by forming a second spacer on the exposed first spacer; removing the second sacrificial layer pattern and the first sacrificial layer patterns; and forming a first pattern having a first pitch defined by the first spacers and a second pattern having a second pitch defined by the dual spacer by etching an exposed portion of the pattern target layer using the first spacers and the dual spacer as etching masks.

The method further preferably includes forming an etching stop layer on the pattern target layer before the first sacrificial layer patterns are formed.

The forming of the first spacers preferably includes forming a first spacer material layer over the pattern target layer and the first sacrificial layer patterns; and removing a portion of the first spacer material layer from the pattern target layer and removing the first spacer material layer from an upper surface of the first sacrificial layer patterns by performing an anisotropic etching process on the first spacer material layer.

The first and second sacrificial layer patterns preferably include an oxide layer.

The forming of the dual spacer preferably includes forming a second spacer material layer over the second sacrificial layer pattern, the exposed first spacer, and the pattern target layer, and removing the second spacer material layer from the second sacrificial layer pattern and removing a portion of the second spacer material layer from the pattern target layer by performing an anisotropic etching process on the second spacer material layer.

DESCRIPTION OF SPECIFIC EMBODIMENTS

Figure 1:
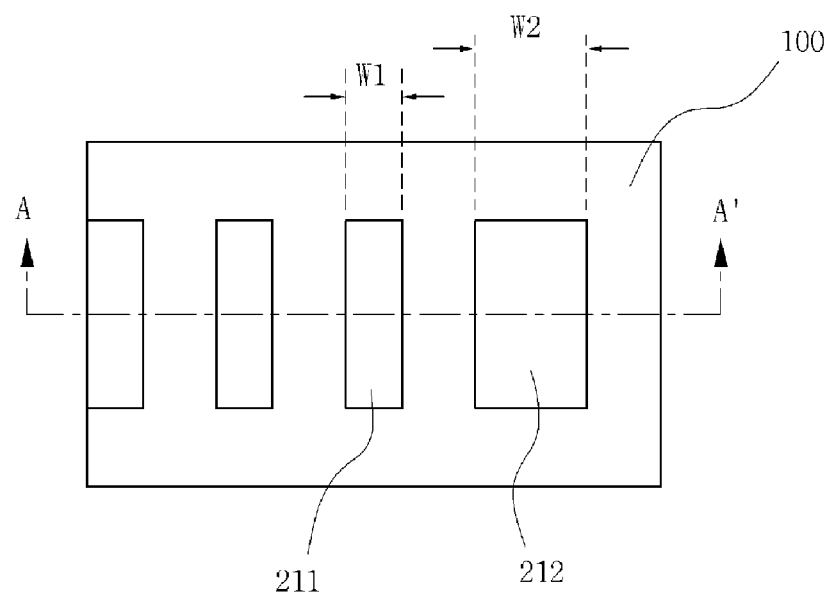
FIG. 1 is a plane view illustrating a pattern structure having different pitches.

FIG. 1 is a plane view illustrating a pattern structure having different pitches. FIGS. 2 to 9 are cross-sectional views, taken along line A-A' shown in FIG. 1, illustrating a process for fabricating patterns in a semiconductor device according to the invention. Referring to FIG. 1, first patterns 211 having first pitches W1 and a second pattern 212 having a second pitch W2, which is wider than the first pitch W1, are formed on a substrate 100. Although the second pattern 212 having a relatively large pitch is disposed on the outermost portion of the substrate 100 in the illustrated embodiment, the second pattern 212 having the large pitch may be disposed at another portion besides the outermost portion, for example, between the first patterns 211 without departing from the scope of the present invention.

Figure 2:
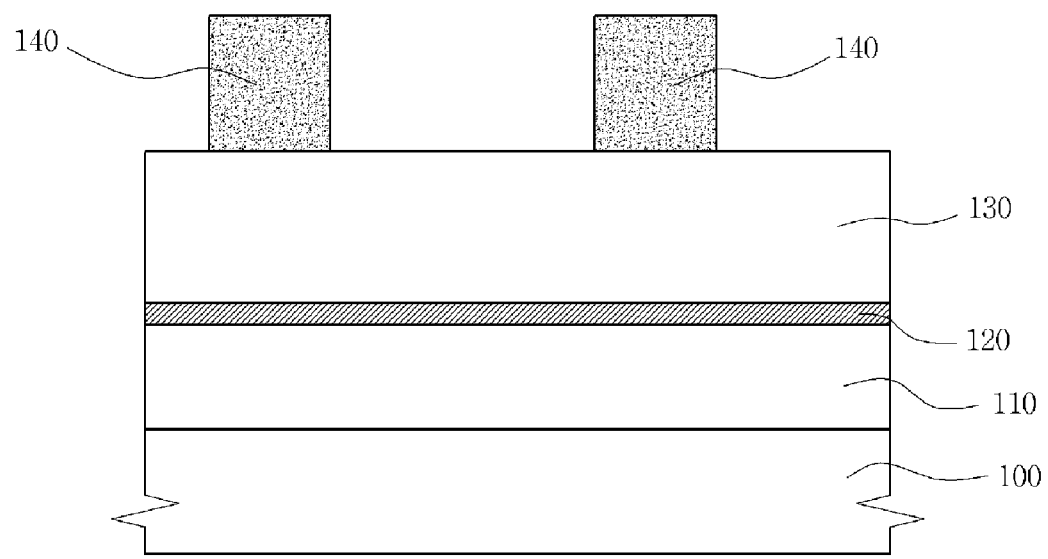
FIGS. 2 to 9 are sectional views illustrating a method of fabricating patterns in a semiconductor device according to the invention.

In order to form the patterns having different pitches, as shown in FIG. 2, a pattern target layer 110 to be formed with the patterns is formed on the substrate 100, and an etching stop layer 120 is formed on the pattern target layer 110. The pattern target layer 110 preferably includes an insulating layer or a conductive layer. The etching stop layer 120 is later used to form a spacer, and includes a material having a sufficient etch selectivity relative to a material layer for forming the spacer. Next, a first sacrificial layer 130 is formed on the etching stop layer 120. The first sacrificial layer 130 preferably includes an oxide layer, but the invention is not limited thereto. A mask layer pattern 140 is formed on the first sacrificial layer 130. The mask layer pattern 140 preferably includes a photoresist layer.

Figure 3:
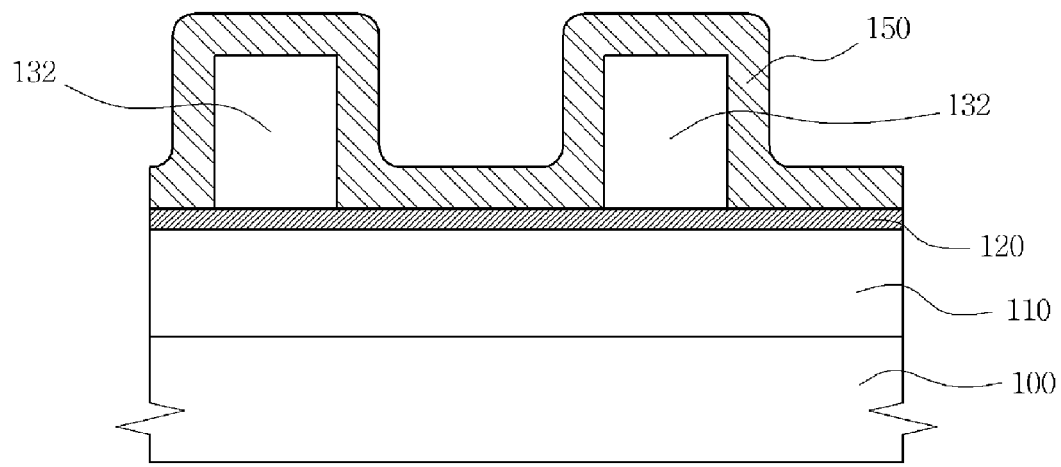

Next, as shown in FIG. 3, an exposed portion of the first sacrificial layer 130 is removed through an etching process using the mask layer pattern 140 as an etching mask, thereby forming a first sacrificial layer pattern 132. After that, the mask layer pattern 140 is removed. Then, a first spacer material layer 150 is formed on the etching stop layer 120 and the first sacrificial layer pattern 132. At this time, the first spacer material layer 150 has a thickness that corresponds to the first pitch W1 of the first pattern 211.

Figure 4:
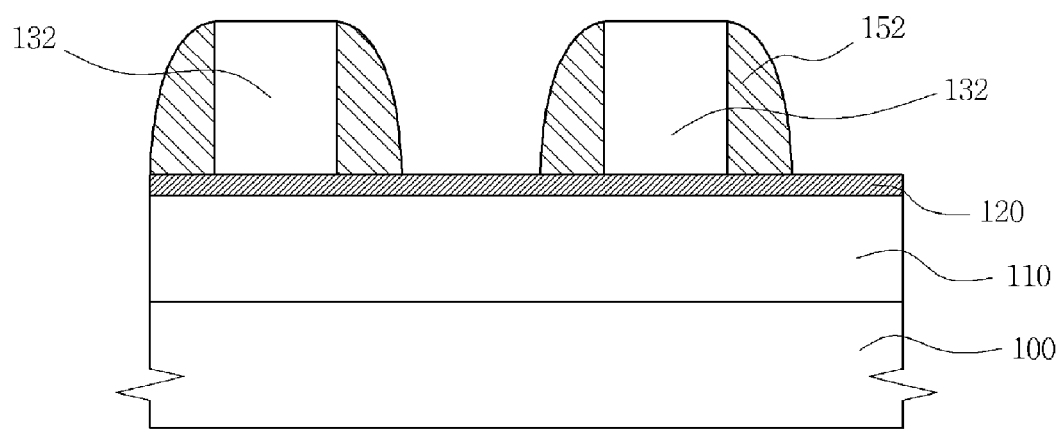

After that, as shown in FIG. 4, an anisotropic etching process is performed on the first spacer material layer 150, so that the first spacer material layer 150 is removed from a portion of the etching stop layer 120 and from an upper surface of the first sacrificial layer pattern 132, thereby forming first spacers 152 at a sidewall of the first sacrificial layer pattern 132. Although the anisotropic etching process is preferably performed using an etch-back process, the invention is not limited thereto.

Figure 5:
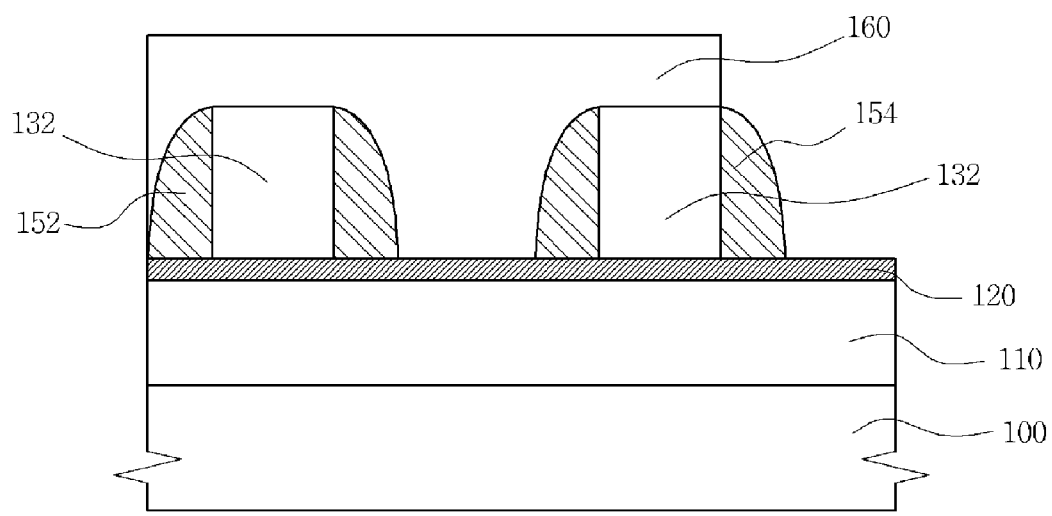

After that, as shown in FIG. 5, a second sacrificial layer pattern 160 is formed on the first sacrificial layer pattern 132 and the first spacers 152. The second sacrificial layer pattern 160 preferably includes an oxide layer. In order to form the second sacrificial layer pattern 160, a second sacrificial layer (not shown) is formed on the entire surface of the first sacrificial layer pattern 132 and the first spacers 152, and then the second sacrificial layer is partially removed using an etching process with a second photoresist layer pattern (not shown), thereby forming the second sacrificial layer pattern 160. As illustrated, the second sacrificial layer pattern 160 exposes one of the first spacers 152 (re-labeled as first spacer 154 in FIGS. 5-9) and covers the remaining first spacers 152. The first spacers 152 covered by the second sacrificial layer pattern 160 are ultimately used to form the first pattern 211 having the relatively narrow first pitch W1, and the first spacer 154 exposed by the second sacrificial layer pattern 160 is ultimately used to form the second pattern 212 having the (relatively wider) second pitch W2.

Figure 6:
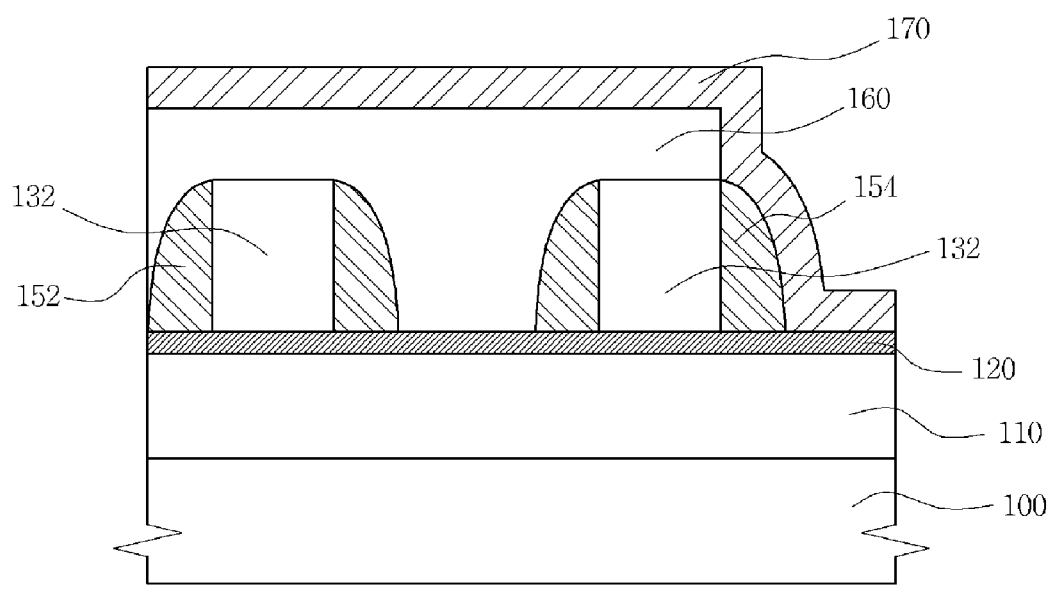

After that, as shown in FIG. 6, a second spacer material layer 170 is formed on the exposed portion of etching stop layer 120, the exposed first spacer 154 and the second sacrificial layer pattern 160. At this time, the second spacer material layer 170 has a thickness such that the combined thickness of the second spacer material layer 170 and the first spacer 154 corresponds to the second pitch W2 of the second pattern 211.

Figure 7:
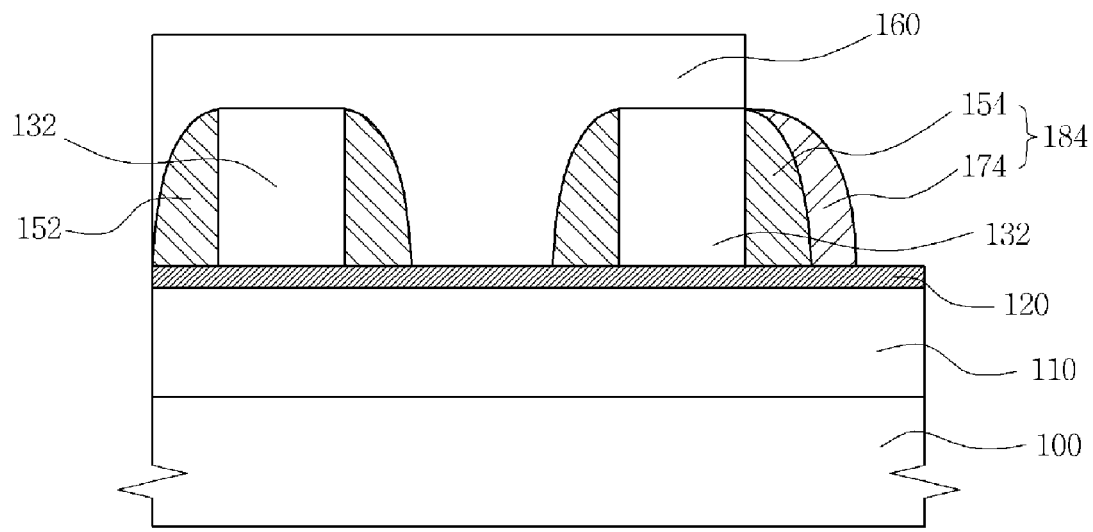

Then, as shown in FIG. 7, an anisotropic etching process is performed on the second spacer material layer 170 (see FIG. 6), thereby removing the second spacer material layer 170 from a portion of the etching stop layer 120 and an exposed surface of the second sacrificial layer pattern 160. Accordingly, a second spacer 174 is formed on the first spacer 154 exposed by the second sacrificial layer pattern 160, so that the first spacer 154 and the second spacer 174 form a double spacer 184 having a thickness that corresponds to the second pitch W2 of the second pattern 212. Although the anisotropic etching process is preferably performed using an etch-back process, the invention is not limited thereto.

Figure 8:
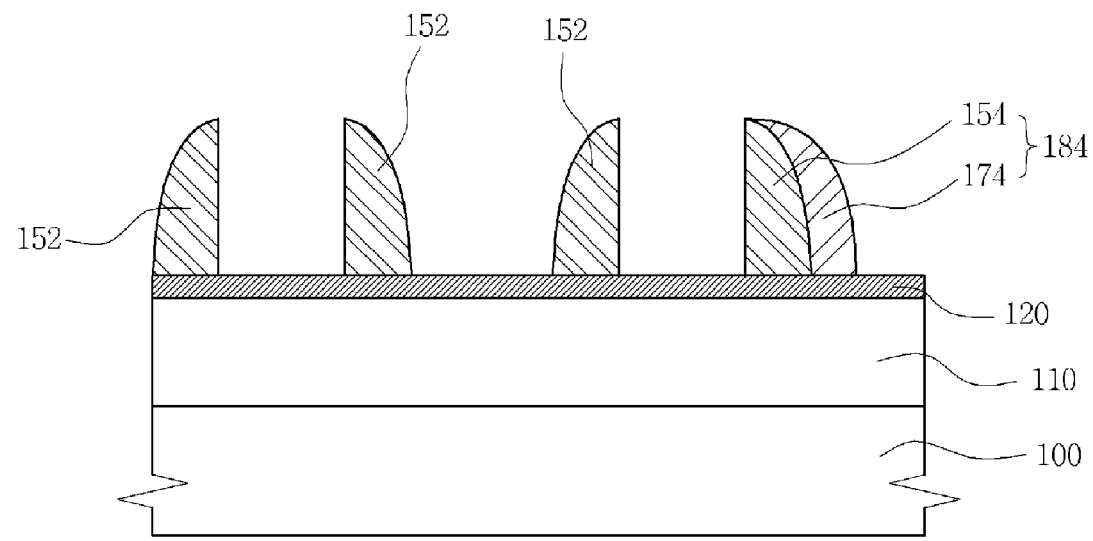

After that, as shown in FIG. 8, the second sacrificial layer pattern 160 is removed, and then the first sacrificial layer pattern 132 is removed. Accordingly, the first spacers 152 having a relatively narrow pitch and the dual spacer 184 having a relatively wider pitch remain on the pattern target layer 110 and the etching stop layer 120.

Figure 9:
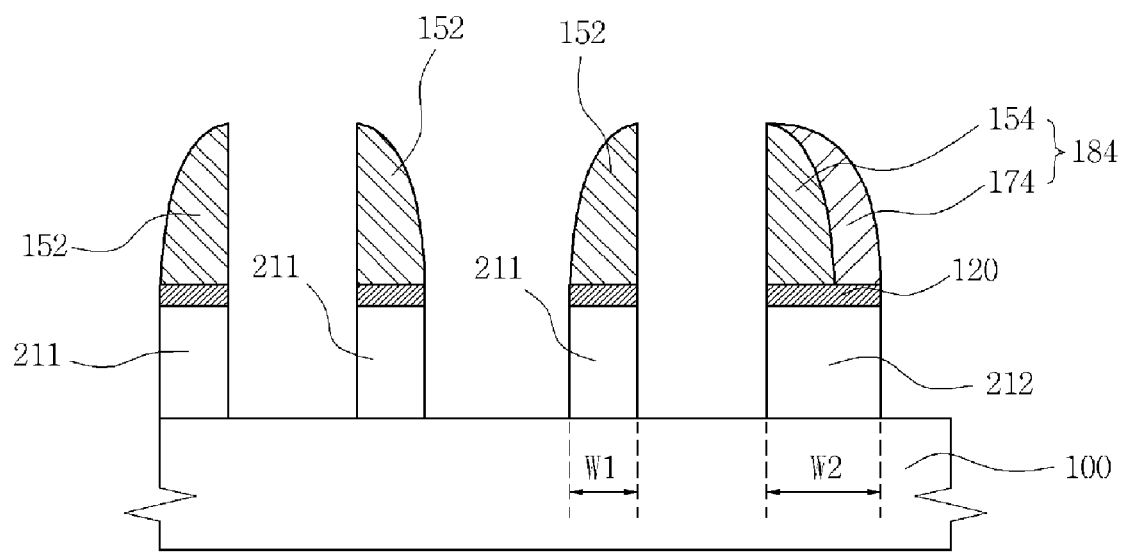

Then, as shown in FIG. 9, exposed portions of the pattern target layer 110 and the etching stop layer 120 are sequentially removed using an etching process using the first spacers 152 and the dual spacer 184 as etching masks. Accordingly, the first patterns 211 have the first pitch W1, which is defined by the first spacers 152, and the second pattern 212 has the second pitch W2, which is defined to be wider than the first pitch W1 by the double spacer 184. In order to form a pattern having an even wider pitch, the process of forming the second spacer 174 may be repeatedly performed according to the desired width of the final composite spacer. For example, a third spacer (not shown) can be formed on the dual spacer 184 to form a triple spacer (not shown), and then an etching process can be performed using the triple spacer as an etching mask, thereby forming the pattern having an even wider pitch.

As described above, according to the method of fabricating the pattern in the semiconductor device in the invention, the first spacers are formed, and sequentially, the dual spacer including at least one of the first spacers and the second spacer is formed by forming the second spacer on at least one of the first spacers, thereby forming the patterns having different pitches, which are defined by the first spacers and the dual spacer. In addition, the patterns having different pitches can be controlled by adjusting the thicknesses of the first spacers and the dual spacer.

Although preferred embodiments of the invention have been described for illustrative purposes, those skilled in the art will appreciate that various modifications, additions and substitutions are possible, without departing from the scope and spirit of the invention as defined in the accompanying claims.

What is claimed is:

1. A method of fabricating patterns in a semiconductor device, comprising:
   forming first sacrificial layer patterns having sidewalls over a pattern target layer;
   forming first spacers at the sidewalls of the first sacrificial layer patterns;
   forming a second sacrificial layer pattern over the first sacrificial layer patterns and the first spacers, wherein at least one of the first spacers is exposed by the second sacrificial layer pattern;
   forming a dual spacer by forming a second spacer on the exposed first spacer;
   removing the second sacrificial layer pattern and the first sacrificial layer patterns; and
   forming a first pattern having a first pitch defined by the first spacers and a second pattern having a second pitch defined by the dual spacer by etching an exposed portion of the pattern target layer using the first spacers and the dual spacer as etching masks.

2. The method of claim 1, further comprising forming an etching stop layer on the pattern target layer before the first sacrificial layer patterns are formed.

3. The method of claim 1, comprising forming the first spacers by:
   forming a first spacer material layer over the pattern target layer and the first sacrificial layer patterns; and
   removing a portion of the first spacer material layer from the pattern target layer and removing the first spacer material layer from an upper surface of the first sacrificial layer patterns by performing an anisotropic etching process on the first spacer material layer.

4. The method of claim 1, wherein the second sacrificial layer pattern comprises an oxide layer.

5. The method of claim 1, comprising forming the dual spacer by:
   forming a second spacer material layer over the second sacrificial layer pattern, the first spacer, and the pattern target layer; and
   removing the second spacer material layer from the second sacrificial layer pattern and removing a portion of the second spacer material layer from the pattern target layer by performing an anisotropic etching process on the second spacer material layer.

6. The method of claim 1, wherein the first sacrificial layer patterns comprise an oxide layer.

* * * * *